United States Patent
Jung

(10) Patent No.: US 9,798,201 B2
(45) Date of Patent: Oct. 24, 2017

(54) LIQUID CRYSTAL DISPLAY DEVICE AND METHOD OF MANUFACTURING THE SAME

(71) Applicant: Samsung Display Co., Ltd., Yongin, Gyeonggi-do (KR)

(72) Inventor: Hyung Gi Jung, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/238,380

(22) Filed: Aug. 16, 2016

(65) Prior Publication Data

US 2017/0068135 A1 Mar. 9, 2017

(30) Foreign Application Priority Data

Sep. 8, 2015 (KR) .................. 10-2015-0126808

(51) Int. Cl.

| | |
|---|---|
| *H01L 27/12* | (2006.01) |
| *G02F 1/1343* | (2006.01) |
| *H01L 29/786* | (2006.01) |
| *H01L 29/417* | (2006.01) |
| *H01L 21/027* | (2006.01) |
| *H01L 21/4763* | (2006.01) |

(Continued)

(52) U.S. Cl.
CPC ...... *G02F 1/134309* (2013.01); *G02F 1/1368* (2013.01); *G02F 1/13439* (2013.01); *H01L 21/0273* (2013.01); *H01L 21/47635* (2013.01); *H01L 27/1225* (2013.01); *H01L 27/1288* (2013.01); *H01L 29/41733* (2013.01); *H01L 29/66969* (2013.01); *H01L 29/7869* (2013.01); *H01L 29/78645* (2013.01); *G02F 2201/121* (2013.01)

(58) Field of Classification Search
CPC ............ G02F 1/134309; G02F 1/1368; G02F 1/13439; G02F 2201/121; H01L 21/0273; H01L 27/1288; H01L 29/78645; H01L 21/47635; H01L 27/1225; H01L 29/41733; H01L 29/66969; H01L 29/7869
See application file for complete search history.

(56) References Cited

U.S. PATENT DOCUMENTS

| | | | |
|---|---|---|---|
| 8,841,188 B2 | 9/2014 | Reznicek et al. | |
| 2007/0020910 A1 * | 1/2007 | Park ...................... | G03F 7/425 |
| | | | 438/612 |

(Continued)

FOREIGN PATENT DOCUMENTS

| | | |
|---|---|---|
| KR | 10-2007-0100443 A | 10/2007 |
| KR | 10-0905472 B1 | 7/2009 |

*Primary Examiner* — Roy Potter
*Assistant Examiner* — Paul Patton
(74) *Attorney, Agent, or Firm* — Innovation Counsel LLP

(57) ABSTRACT

Provided are liquid crystal display and the method for manufacturing the same. According to an aspect of the present disclosure, there is provided a liquid crystal display device, including: a first substrate; a gate electrode disposed on the first substrate; a semiconductor pattern layer disposed on the gate electrode; and a source electrode and a drain electrode disposed on the semiconductor pattern layer and facing each other, wherein the gate electrode includes a reference plane and a protrusion protruding from the reference plane in a horizontal direction, and the protrusion overlaps the source electrode and the drain electrode.

14 Claims, 8 Drawing Sheets

(51) Int. Cl.
    *H01L 29/66*       (2006.01)
    *G02F 1/1368*      (2006.01)

(56) References Cited

U.S. PATENT DOCUMENTS

| | | | |
|---|---|---|---|
| 2011/0079781 A1* | 4/2011 | Chang | H01L 29/41733 |
| | | | 257/59 |
| 2012/0249904 A1* | 10/2012 | Morosawa | H01L 27/1225 |
| | | | 349/38 |
| 2014/0187010 A1 | 7/2014 | Lii | |
| 2014/0209855 A1 | 7/2014 | Cea et al. | |
| 2014/0357034 A1 | 12/2014 | Cheng et al. | |

* cited by examiner

LIQUID CRYSTAL DISPLAY DEVICE AND METHOD OF MANUFACTURING THE SAME

This application claims priority from Korean Patent Application No. 10-2015-0126808 filed on Sep. 8, 2015 in the Korean Intellectual Property Office, the disclosure of which is incorporated herein by reference in its entirety.

BACKGROUND

1. Field of the Disclosure

The present disclosure relates to a liquid crystal display device and a method of manufacturing the same.

2. Description of the Related Art

The importance of a display device has increased with the development of multimedia. Accordingly, various types of liquid crystal devices, such as a liquid crystal display (LCD) device, an organic light emitting display (OLED) device, and the like, have been used.

Among these, a liquid crystal display device, which is one of the most widely used flat panel display devices, includes two substrates provided with field generating electrodes, such as a pixel electrode and a common electrode, and a liquid crystal layer disposed between the two substrates. The liquid crystal display device is configured such that when a voltage is applied to the field generating electrodes to generate an electric field in the liquid crystal layer, the direction of liquid crystal molecules in the liquid crystal layer is determined, thereby controlling the polarization of incident light to display an image.

Generally, the liquid crystal display device requires a large-sized substrate, such as a glass substrate, and a thin film transistor (TFT) having excellent performance.

SUMMARY

Aspects of the present disclosure provide a liquid crystal display device that prevents the characteristics of a semiconductor pattern layer from being deteriorated by the light provided from a backlight unit.

Aspects of the present disclosure also provide a method of manufacturing a liquid crystal display device that prevents the characteristics of a semiconductor pattern layer from being deteriorated by the light provided from a backlight unit.

According to an aspect of the present disclosure, there is provided a liquid crystal display device, including: a first substrate; a gate electrode disposed on the first substrate; a semiconductor pattern layer disposed on the gate electrode; and a source electrode and a drain electrode disposed on the semiconductor pattern layer and facing each other, wherein the gate electrode includes a reference plane and a protrusion protruding from the reference plane in a horizontal direction, and the protrusion overlaps the source electrode and the drain electrode.

The gate electrode may include a first sub gate electrode and a second sub gate electrode disposed on the first sub gate electrode, the first sub gate electrode may include an overlapping area in which the first sub gate electrode overlaps the second sub gate electrode, and non-overlapping areas in which the first sub gate electrode does not overlap the second sub gate electrode, and the protrusion may include the non-overlapping areas.

The first sub gate electrode and the second sub gate electrode may be made of materials different from each other.

The gate electrode may include: a first sub gate electrode; a second sub gate electrode disposed on the first sub gate electrode; and a third sub gate electrode disposed on the second sub gate electrode, wherein the first sub gate electrode and the second sub gate electrode include an overlapping area in which the first sub gate electrode and the second sub gate electrode overlap the third sub gate electrode, and non-overlapping areas in which the first sub gate electrode and the second sub gate electrode do not overlap the third sub gate electrode, and the protrusion includes the non-overlapping areas of the first sub gate electrode and the second sub gate electrode.

The third sub gate electrode and the second sub gate electrode may be made of materials different from each other.

The third sub gate electrode and the first sub gate electrode may be made of materials the same as each other.

The width of the protrusion may be equal to the width of the source electrode or the drain electrode overlapping the protrusion.

The source electrode may include a bar-shaped portion and a U-shaped portion, and the protrusion may overlap the bar-shaped portion of the source electrode.

A plurality of protrusions may be disposed to correspond to the source electrode and the drain electrode.

The source electrode may include first to third source electrodes, the drain electrode may include first to third drain electrodes corresponding to the first to third source electrodes, and the protrusion may include first to fifth protrusions, wherein the first to fifth protrusions may respectively overlap the first to third source electrodes and the first to third drain electrodes.

The liquid crystal display device may further include: a second substrate facing the first substrate; and a common electrode disposed on the second substrate.

According to another aspect of the present disclosure, there is provided a method of manufacturing a liquid crystal display device, including: providing a first substrate including a first conductive film and a second conductive film disposed on the first conductive film; forming a first photoresist pattern on the second conductive film; and forming a gate electrode including a first sub gate electrode and a second sub gate electrode by etching the first conductive film and the second conductive film using the first photoresist pattern as an etching mask, wherein the gate electrode includes a reference plane and a protrusion protruding from the reference plane in a horizontal direction.

The first conductive film and the second conductive film may be made of materials having etch rates different from each other with respect to a predetermined etchant.

The forming the gate electrode including the first sub gate electrode and the second sub gate electrode by etching the first conductive film and the second conductive film using the first photoresist pattern as an etching mask may include: wet-etching the first conductive film and the second conductive film.

The forming the gate electrode including the first sub gate electrode and the second sub gate electrode by etching the first conductive film and the second conductive film using the first photoresist pattern as an etching mask may include: over-etching the second sub gate electrode to form the protrusion as a part of the first sub gate electrode after forming the first sub gate electrode and the second sub gate electrode by etching the first conductive film and the second conductive film.

However, aspects of the present disclosure are not restricted to the one set forth herein. The above and other aspects of the present disclosure will become more apparent to one of ordinary skill in the art to which the present disclosure pertains by referencing the detailed description given below.

BRIEF DESCRIPTION OF THE DRAWINGS

The above and other aspects and features of the present disclosure will become more apparent when the exemplary embodiments described herein are considered with reference to the attached drawings, in which.

DETAILED DESCRIPTION OF THE EMBODIMENTS

Figure 1:
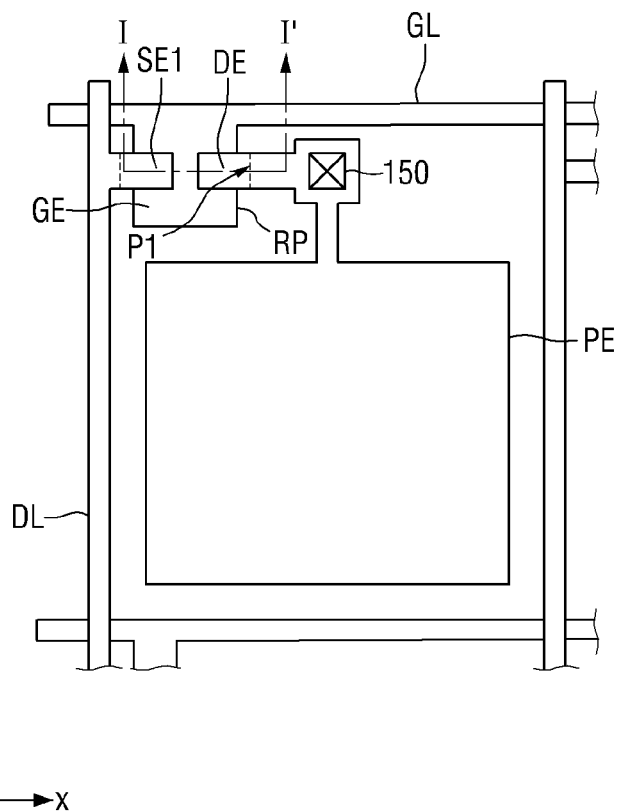
FIG. 1 is a plan view of a liquid crystal display device according to an embodiment of the present disclosure.

The aspects and features of the present disclosure and methods for achieving the aspects and features will be apparent by referring to the embodiments described in detail with reference to the accompanying drawings. However, the present disclosure is not limited to the embodiments disclosed hereinafter but may be implemented in diverse forms. The matters defined in the description, such as the detailed construction and elements, are provided to assist those of ordinary skill in the art in a comprehensive understanding of the disclosure and are non-limiting.

The term "on" that is used to designate that an element is on another element or located on a different layer or a layer includes both a case in which an element is located directly on another element or a layer and a case in which an element is located on another element via another layer or still another element. In the entire description of the present disclosure, the same drawing reference numerals are used for the same elements across various figures.

Although the terms "first," "second," and so forth are used to describe diverse constituent elements, such constituent elements are not limited by the terms. The terms are used only to distinguish a constituent element from other constituent elements. Accordingly, in the following description, a first constituent element may be a second constituent element.

Hereinafter, exemplary embodiments of the present disclosure are described in detail with reference to the attached drawings.

Figure 2:
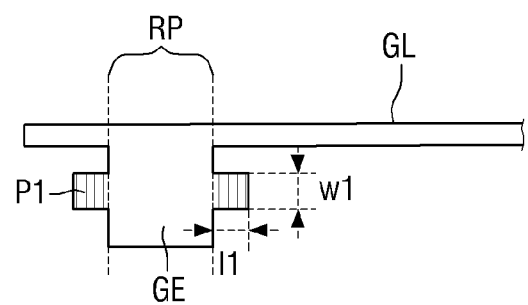
FIG. 2 is a plan view showing only a part of the configuration of FIG. 1.
Figure 3:
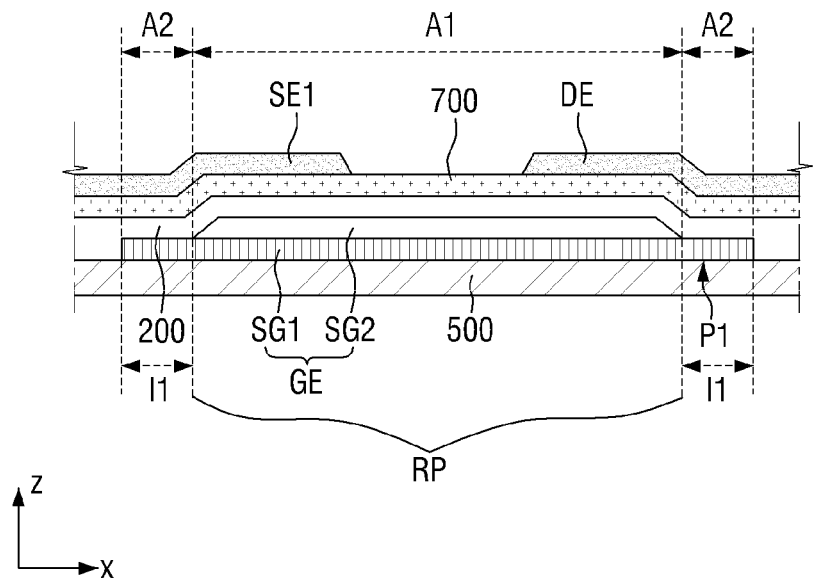
FIG. 3 is a cross-sectional view taken along the line I-I' of FIG. 1.

FIG. 1 is a plan view of a liquid crystal display device according to an embodiment of the present disclosure. FIG. 2 is a plan view showing only a part of the configuration of FIG. 1. FIG. 3 is a cross-sectional view taken along the line I-I' of FIG. 1.

Referring to FIGS. 1 to 3, a liquid crystal display device 10 according to an embodiment of the present disclosure includes a first substrate 500, a gate electrode GE disposed on the first substrate 500, a semiconductor pattern layer 700 disposed on the gate electrode GE, and a source electrode SE1 and a drain electrode DE disposed on the semiconductor pattern layer 700 and facing each other. Here, the gate electrode GE includes a reference plane RP and a protrusion P1 extending from the reference plane (RP) in a horizontal direction.

The first substrate 500 may be made of a material having heat resistance and transparency. For example, the first substrate 500 may be made of transparent glass or plastic, but the present disclosure is not limited thereto.

A gate wiring (GL, GE) may be disposed on the first substrate 500. The gate wiring (GL, GE) may include a gate line GL receiving a driving signal, a gate electrode GE protruding from the gate line GL, and a gate end (not shown) disposed on at least one end of the gate line GL.

The gate line GL may extend in a first direction. The first direction may be substantially identical to the X-axis direction of FIG. 1. The gate electrode GE may constitute three terminals of a thin film transistor together with a source electrode SE1 and a drain electrode DE, which are described later.

The gate wiring (GL, GE) may contain one or more of an aluminum (Al)-base metal including an aluminum alloy, a silver (Ag)-based metal including a silver alloy, a copper (Cu)-based metal including a copper alloy, a molybdenum (Mo)-based metal including a molybdenum alloy, chromium (Cr), titanium (Ti), and tantalum (Ta). However, these metal and alloys are illustrative, and the material of the gate wiring (GL, GE) is not limited thereto. Any metal or polymer capable of being used for realizing a desired display device may be used as the material of the gate wiring (GL, GE).

The gate wiring (GL, GE) may have a single layer structure but is not limited thereto. The gate wiring (GL, GE) may have a double layer structure, a triple layer structure, or other multi-layer structures.

The gate electrode GE of the liquid crystal display according to an embodiment of the present disclosure may include a reference plane RP and a protrusion P1 extending from the reference plane RP.

The reference plane RP, as shown in FIG. 1, may be a plane extending from a side not overlapping the source electrode SE1 and the drain electrode DE in the perimeter of the gate electrode GE in horizontal and vertical directions. In an exemplary embodiment, the reference plane RP may include a lateral side of the gate electrode GE. However, when the lateral side of the gate electrode GE is inclined (refer to FIG. 3), the reference plane RP may be plane formed by extending a side not overlapping the source electrode SE1 and the drain electrode DE in the outermost edge of the gate electrode GE in horizontal and vertical directions. For reference, in the specification, the vertical direction may be the Z-axis direction of FIG. 3, and the horizontal direction may be any one direction parallel to the XY plane of FIG. 1.

That is, it can be understood that the above-described first direction and a second direction described below are included in the horizontal direction.

The protrusion P1 may protrude from the reference plane (RP). The protrusion P1 may protrude from the reference plane (RP) in the horizontal direction. When the source electrode SE1 and the drain electrode DE, as shown in FIG. 1, extend in the positive direction of X-axis or the negative direction of X-axis, the protrusion P1 may extend in the positive direction of X-axis and/or the negative direction of X-axis.

The protrusion may overlap the source electrode SE1 and the drain electrode DE, which are described later. For the convenience of explanation, the following terms are used. The length of the protrusion P1 protruding from the reference plane RP, that is, the distance between the reference plane RP and the end of the protrusion P1, is represented by a first length l1. In addition, the width of the protrusion P1, that is, the width of the protrusion P1 in a direction parallel to the extension direction of the reference plane RP, is represented by a first width w1.

The first width w1 of the protrusion P1 may be substantially equal to the width of the source electrode SE1 or the drain electrode DE. However, the first width w1 of the protrusion P1 is not limited thereto, and may be greater than the width of the source electrode SE1 or the drain electrode DE. When the first width w1 of the protrusion P1 may be substantially equal to the width of the source electrode SE1 or the drain electrode DE, due to the presence of the protrusion P1, it is possible to prevent an aperture ratio from being reduced.

The first length l1 of the protrusion P1 overlapping the source electrode SE1 may be shorter than the distance between the data line DL and the gate line GE in FIG. 1. The first length l1 of the protrusion P1 overlapping the drain electrode DE may be shorter than the distance between the gate electrode GE and the drain electrode expansion part 150 in FIG. 1.

That is, the end of the protrusion P1 overlapping the source electrode SE1 may be disposed between the data line DL and the gate electrode GE, and the end of the protrusion P1 overlapping the drain electrode DE may be disposed between the gate electrode GE and the drain electrode expansion portion 150.

Hereinafter, the gate electrode GE of the liquid crystal display according to some embodiments of the present disclosure is described in more detail with reference to FIG. 3.

The gate electrode GE may include a first sub gate electrode SG1 disposed on the first substrate 500 and a second sub gate electrode SG2 disposed on the first sub gate electrode SG1.

For example, the first sub gate electrode SG1 and the second sub gate electrode SG2 may be made of materials different from each other. Specifically, the first sub gate electrode SG1 and the second sub gate electrode SG2 may be made of materials different from each other such that they have etch rates different from each other with respect to the same etchant.

The first sub gate electrode SG1 and the second sub gate electrode SG2 may partially overlap each other. The width of the first sub gate electrode SG1 may be greater than the width of the second sub gate electrode SG2. Therefore, the first sub gate electrode SG1 may include an overlapping area A1 in which the first sub gate electrode SG1 overlaps the second sub gate electrode SG2, and non-overlapping areas A2 in which the first sub gate electrode SG1 does not overlap the second sub gate electrode SG2. The non-overlapping areas A2 may be disposed at both sides of the overlapping area A1. That is, the non-overlapping areas A2 may protrude from the lateral side of the second sub gate electrode SG2 in the horizontal direction. In other words, the protrusion P1 of the gate electrode GE may include the non-overlapping areas A2. That is, the protrusion P1 may be formed to be integrated with the first sub gate electrode SG1. In other words, the protrusion P1 may be made of substantially the same material as the first sub gate electrode SG1.

In this case, the reference plane may be a virtual plane extending from the perimeter of the second sub gate electrode SG2 in the vertical and horizontal directions.

The semiconductor pattern layer 700 may contain amorphous silicon or polycrystalline silicon, but the present disclosure is not limited thereto. The semiconductor pattern layer 700 may be made an oxide semiconductor.

The semiconductor pattern layer 700 may have various shapes, such as an island shape, linear shape, and the like. When the semiconductor pattern layer 700 has a linear shape, the semiconductor pattern layer 700 may be disposed under the data line DL to extend to the upper portion of the gate electrode GE.

In exemplary embodiment, the semiconductor pattern layer 700 may be patterned in an area excluding a channel in substantially the same shape as a data wiring (DL, SE, DE, 150), which is described later. In other words, the semiconductor pattern layer 700 may be disposed to overlap the data wiring (DL, SE, DE, 150) over the entire area excluding the channel. The channel may be disposed between a source electrode SE and a drain electrode facing each other. The channel serves to electrically connect the source electrode SE and the drain electrode DE, and the specific shape thereof is not particularly limited.

The semiconductor pattern layer 700 may be provided thereon with an ohmic contact layer (not shown) doped with n-type impurities in a high concentration. The ohmic contact layer may overlap the entire semiconductor pattern layer 700 or a part of the semiconductor pattern layer 700. However, in an exemplary embodiment in which the semiconductor pattern layer 700 contains an oxide semiconductor, the ohmic contact layer may be omitted.

The data wiring (DL, SE, DE, 150) may be disposed on the semiconductor pattern layer 700. The data wiring (DL, SE, DE, 150) may include: a data line DL extending in the second direction, for example, in the Y-axis direction of FIG. 1, to intersect with a gate line GL; a source electrode SE branched from the data line DL to extend to the upper portion of the semiconductor pattern layer 700; a drain electrode DE spaced apart from the source electrode SE and disposed on the semiconductor pattern layer 700 to face the source electrode SE with a gate electrode GE or a channel as a center; and a drain electrode expansion part 150 extending from the drain electrode DE to be electrically connected with a pixel electrode PE. Since the drain electrode expansion part 150 has a larger width than the drain electrode DE, it can be more easily electrically connected with the pixel electrode PE.

The data wiring (DL, SE, DE, 150) may have a single layer structure or multi-layer structure made of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), or tantalum (Ta). Further, the single layer structure or multi-layer structure may also be made of an alloy of the above metal and one or more elements selected from the group consisting of titanium (Ti), zirconium (Zr), tungsten (W), tantalum (Ta), niobium (Nb), platinum (Pt), hafnium (Hf), oxygen (O), and nitrogen (N). However, the above materials are illustrative, and the material of the data wiring (DL, SE, DE, 150) is not limited thereto.

FIG. 1 illustrates a case in which one thin film transistor is disposed in one pixel, but the scope of the present disclosure is not limited thereto. That is, in another exemplary embodiment, a plurality of thin film transistors may be disposed in one pixel.

A passivation layer 600 may be disposed on the data wiring (DL, SE, DE, 150) and the semiconductor pattern layer 700. The passivation layer 600 may contain an inorganic insulating material. For example, the passivation layer 600 may be made of silicon oxide, silicon nitride, silicon oxynitride, aluminum oxynitride, titanium oxynitride, zirconium oxynitride, hafnium oxynitride, tantalum oxynitride, or tungsten oxynitride. However, the above materials are illustrative, and the material of the passivation layer is not limited thereto.

A contact hole for exposing a drain electrode expansion part 150 may be formed in the passivation layer 600.

A pixel electrode PE may be disposed on the passivation layer 600. The pixel electrode PE may be electrically connected to the drain electrode DE through the contact hole formed in the passivation layer 600.

In an exemplary embodiment, the pixel electrode PE may be made of a transparent conductor, such as indium tin oxide (ITO) or indium zinc oxide (IZO), or a reflective conductor, such as aluminum.

FIG. 1 illustrates a case in which the pixel electrode PE has a flat shape, but the shape of the pixel electrode PE is not limited thereto. That is, in another exemplary embodiment, the pixel electrode may be a structure having one or more slits. Further, in still another exemplary embodiment, one or more pixel electrodes may be disposed, and voltages different from each other may be applied to the plurality of pixel electrodes.

As described above, when the gate electrode GE includes the protrusion P1, it is possible to prevent the light provided from a backlight unit toward the first substrate 500 from climbing the lateral side of the gate electrode to damage the semiconductor pattern layer 700. Thus, it is possible to prevent the characteristics of the semiconductor pattern layer 700 from being deteriorated by the light provided from the backlight unit, and to suppress the occurrence of leakage of a thin film transistor.

Hereinafter, a liquid crystal display device according to another embodiment of the present disclosure is described. In the following embodiment, the same reference numerals refer to the same or like parts for the same configuration as the above-described configuration, and duplicate description thereof is omitted or simplified.

Figure 4:
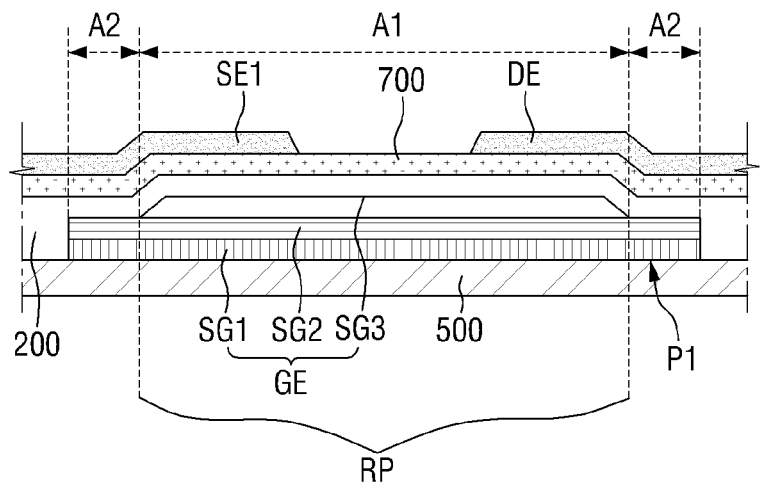
FIG. 4 is a cross-sectional view of a liquid crystal display device according to another embodiment of the present disclosure.

FIG. 4 is a cross-sectional view of a liquid crystal display device according to an embodiment of the present disclosure.

Referring to FIG. 4, a liquid crystal display device according to an embodiment of the present disclosure is different from the liquid crystal display device shown in FIG. 3 in that this liquid crystal display device includes a first sub gate electrode SG1, a second sub gate electrode SG2, and a third sub gate electrode SG3.

The gate electrode GE may have a triple layer structure. Specifically, the gate electrode GE may include a first sub gate electrode SG1 disposed on the first substrate 500, a second sub gate electrode SG2 disposed on the first sub gate electrode SG1, and a third sub gate electrode SG3 disposed on the second sub gate electrode SG2.

As described above, the first sub gate electrode SG1, the second sub gate electrode SG2, and the third sub gate electrode SG3 may be made of one or more of an aluminum (Al)-base metal including an aluminum alloy, a silver (Ag)-based metal including a silver alloy, a copper (Cu)-based metal including a copper alloy, a molybdenum (Mo)-based metal including a molybdenum alloy, chromium (Cr), titanium (Ti), and tantalum (Ta). However the first sub gate electrode SG1, the second sub gate electrode SG2, and the third sub gate electrode SG3 may be made of materials different form one another. However, in another exemplary embodiment, the third sub gate electrode SG3 and the second sub gate electrode SG2 may be made of materials different from each other, and the third sub gate electrode SG3 and the first sub gate electrode SG1 may be made of materials the same as each other.

The first sub gate electrode SG1, the second sub gate electrode SG2, and the third sub gate electrode SG3 may at least partially overlap one another. However, the width of the first sub gate electrode SG1 and the width of the second sub gate electrode SG2 may be greater than the width of the third sub gate electrode SG3. Further, the width of the first sub gate electrode SG1 may be substantially equal to the width of the second sub gate electrode SG2.

In this case, the first sub gate electrode SG1 and the second sub gate electrode SG2 may include an overlapping area A1 in which the first sub gate electrode SG1 and the second sub gate electrode SG2 overlap the third sub gate electrode SG3, and non-overlapping areas A2 in which the first sub gate electrode SG1 and the second sub gate electrode SG2 do not overlap the third sub gate electrode SG3. The non-overlapping areas A2 may be disposed at both sides of the overlapping area A1. That is, the non-overlapping areas A2 may protrude from the lateral side of the third sub gate electrode SG3 in the horizontal direction. In other words, the protrusion P2 of the gate electrode GE may include the non-overlapping areas A2 of the first sub gate electrode SG1 and the second sub gate electrode SG2. That is, the protrusion P2 may have a double layer structure, and may be formed to be integrated with the first sub gate electrode SG1 and the second sub gate electrode SG2. In other words, the protrusion P2 may be made of substantially the same material as the first sub gate electrode SG1 and the second sub gate electrode SG2.

In this case, the reference plane may be a virtual plane extending from the perimeter of the third sub gate electrode SG3 in the vertical and horizontal directions.

Figure 5:
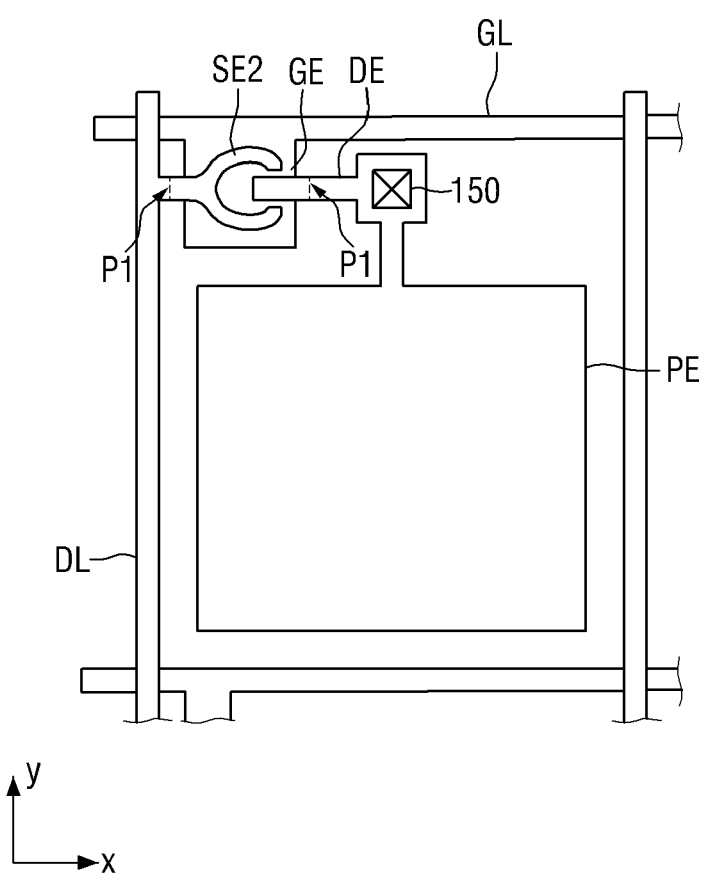
FIG. 5 is a plan view of a liquid crystal display device according to another embodiment of the present disclosure.

FIG. 5 is a plan view of a liquid crystal display device according to another embodiment of the present disclosure.

Referring to FIG. 5, a liquid crystal display device according to another embodiment of the present disclosure is different from the liquid crystal display device shown in FIG. 1 in that this liquid crystal display device includes a source electrode SE2 having a U-shape.

The source electrode SE2 may include an electrode having a horseshoe shape, that is, a U shape. In this case, the drain electrode DE facing the source electrode SE2 may be disposed in the inner space, that is, the U-shaped recess defined by the U-shaped source electrode SE2.

Specifically, the source electrode SE2 may extend from the data line DL, and the end thereof may have a U shape. That is, one end of the source electrode SE2 may have a bar shape, and the other end thereof may have a U shape. The protrusion P1 may overlap the bar-shaped portion of the source electrode SE2. That is, the U-shaped portion of the source electrode SE2 may entirely overlap the gate electrode GE, and the bar-shaped portion thereof may partially overlap the gate electrode GE. In this case, the protrusion P1 may overlap the bar-shaped portion of the source electrode SE2, and the first width w1 of the protrusion P1 may be substantially equal to the width of the bar-shaped portion of the source electrode SE2.

Figure 6:
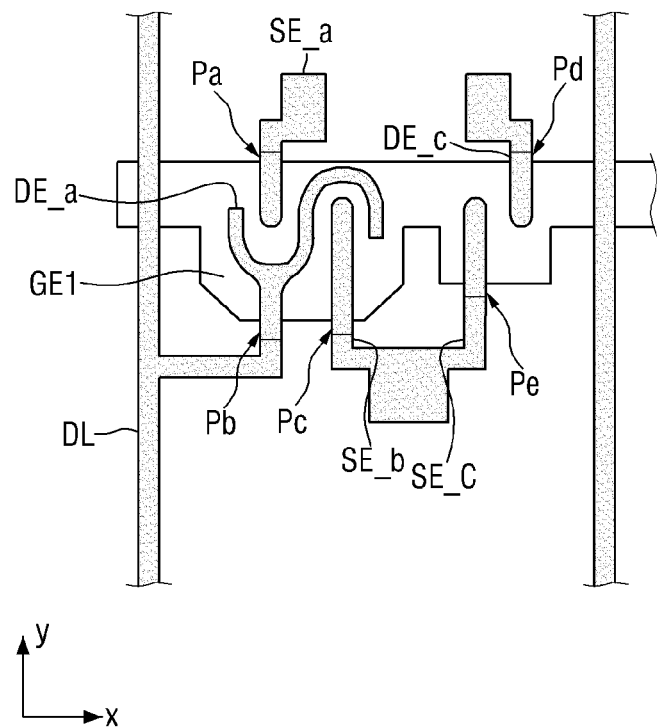
FIG. 6 is a plan view of a liquid crystal display device according to still another embodiment of the present disclosure.
Figure 7:
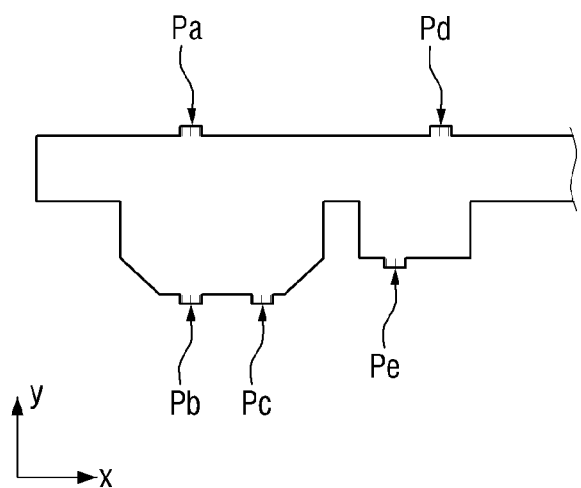
FIG. 7 is a plan view showing only a part of the configuration of FIG. 6.

FIG. 6 is a plan view of a liquid crystal display device according to still another embodiment of the present disclosure. FIG. 7 is a plan view showing only a part of the configuration of FIG. 6.

Referring to FIGS. 6 and 7, a liquid crystal display device according to still another embodiment of the present disclosure is different from the liquid crystal display device shown in FIG. 1 in that this liquid crystal display device includes a plurality of thin film transistors in on pixel.

As described above, a plurality of thin film transistors are disposed in one pixel.

FIGS. 6 and 7 illustrate a case that three thin film transistors are disposed in one pixel.

Explaining this, the liquid crystal display device according to still another embodiment of the present disclosure includes a first drain electrode DE_a extending from a data line DL. The first drain electrode DE_a may include a bar-shaped portion and a U-shaped portion disposed at the end of the bar-shaped portion.

A first source electrode SE_a may be disposed so as to correspond to the first drain electrode DE_a. The first source electrode SE_a may be disposed in the recessed space of the U-shaped portion. In other words, the first drain electrode DE_a may surround at least a part of the first source electrode SE_a.

A second drain electrode DE_b may be disposed adjacent to the first drain electrode DE_a. The second drain electrode DE_b may be formed to be integrated with the first drain electrode DE_a. Further, the second drain electrode DE_b may include a U-shaped portion.

A second source electrode SE_b may be disposed to face the second drain electrode DE_b. The second drain electrode DE_b may surround at least a part of the second source electrode SE_b. The second source electrode SE_b may have a bar shape and may extend. A third source electrode SE_c may be disposed adjacent the second source electrode SE_b.

The third source electrode SE_c may be formed to be integrated with the second source electrode SE_b. The third source electrode SE_c may have a bar shape extending in a longitudinal direction. A third drain electrode DE_c may be disposed to face the third source electrode SE_c. The third drain electrode DE_c may have a bar shape extending in a longitudinal direction.

The third source electrode SE_c and the third drain electrode DE_c may face each other in a horizontal direction. That is, a part of the lateral side of the third source electrode SE_c and a part of the lateral side of the third drain electrode DE_c may face each other.

The reference plane RP may be a plane formed by extending a side not overlapping the source electrode and the drain electrode in the perimeter of the gate electrode GE1 in horizontal and vertical directions. As described in the liquid crystal display devices according to some embodiments of the present disclosure, the following protrusions may protrude from the reference plane RP at predetermined distances.

In this case, the liquid crystal display device according to still another embodiment of the present disclosure may include first to fifth protrusions Pa to Pe.

The first protrusion Pa may be disposed to overlap the bar-shaped portion of the first source electrode SE_a. The second protrusion Pb may be disposed to overlap the bar-shaped portion of the first drain electrode DE_a. The third protrusion Pc may be disposed to overlap the bar-shaped portion of the second source electrode SE_b. The fourth protrusion Pd may be disposed to overlap the bar-shaped portion of the third drain electrode DE_c. The fifth protrusion Pe may be disposed to overlap the bar-shaped portion of the third source electrode SE_c.

As described above, in an exemplary embodiment, the gate electrode GE may include the first sub gate electrode SG1 and the second sub gate electrode SG2. In this case, the first to fifth protrusions Pa to Pe may be formed to be integrated with the first sub gate electrode SG1. That is, the first to fifth protrusions Pa to Pe may be made of substantially the same material as the first sub gate electrode SG1.

It is exemplified in the present embodiment that the liquid crystal display device has five protrusions Pa to Pe. However, the number of protrusions is illustrative, and is not limited thereto. That is, in another embodiment, some of the five protrusions may be omitted. Further, in another embodiment, the number of protrusions may exceed five.

When the protrusions are disposed as above, it is possible to prevent the light provided from a backlight unit toward the first substrate 500 from intruding into the semiconductor pattern layer 700 along the lateral side of the gate electrode GE to damage the semiconductor pattern layer 700.

Figure 8:
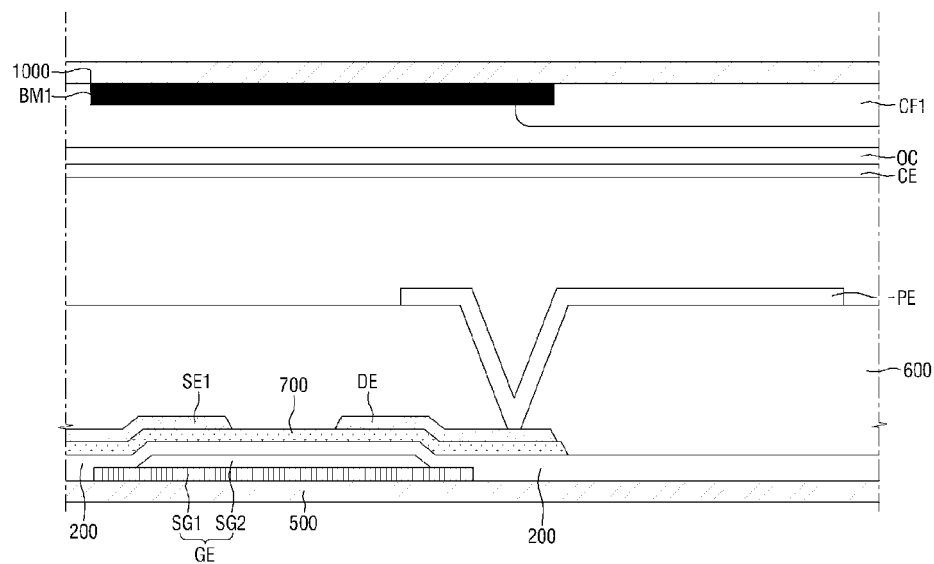
FIG. 8 is a cross-sectional view of a liquid crystal display device according to still another embodiment of the present disclosure.

FIG. 8 is a cross-sectional view of a liquid crystal display device according to still another embodiment of the present disclosure.

Referring to FIG. 8, a liquid crystal display device according to still another embodiment of the present disclosure may further include a second substrate 1000 facing the first substrate 500.

Since the source electrode SE and the drain electrode DE may be disposed on the first substrate 500 as described with reference to FIG. 3, a detailed description thereof is omitted.

A passivation layer 600 may be disposed on the data wiring (DL, SE, DE, 150) and the semiconductor pattern layer 700. The passivation layer 600 may contain an inorganic insulating material. For example, the passivation layer 600 may be made of silicon oxide, silicon nitride, silicon oxynitride, aluminum oxynitride, titanium oxynitride, zirconium oxynitride, hafnium oxynitride, tantalum oxynitride, or tungsten oxynitride. However, the above materials are illustrative, and the material of the passivation layer is not limited thereto.

A contact hole for exposing a drain electrode expansion part 150 may be formed in the passivation layer 600.

A pixel electrode PE may be disposed on the passivation layer 600. The pixel electrode PE may be electrically connected to the drain electrode DE through the contact hole formed in the passivation layer 600.

In an exemplary embodiment, the pixel electrode PE may be made of a transparent conductor, such as indium tin oxide (ITO) or indium zinc oxide (IZO), or a reflective conductor, such as aluminum.

The second substrate 1000 may be made of a material having heat resistance and transparency. For example, the second substrate 1000 may be made of transparent glass or plastic, but the present disclosure is not limited thereto.

A black matrix BM1, as a light blocking member for preventing light leakage and light interference between adjacent pixel areas, may be disposed on the second substrate 1000. Further, a color filter CF1 of red, blue, and green may be disposed for each unit pixel.

An overcoat layer OC made of an organic material may be disposed on the black matrix BM1 and the color filter CF1.

In the present embodiment, since the overcoat layer OC may be commonly known overcoat layers OC or obvious combinations thereof, a detail description thereof is omitted.

A common electrode CE may be disposed on the overcoat layer OC. The common electrode CE may be a front electrode, and may be made of a transparent conductor, such as indium tin oxide (ITO) or indium zinc oxide (IZO), or a reflective conductor, such as aluminum.

Figure 9:
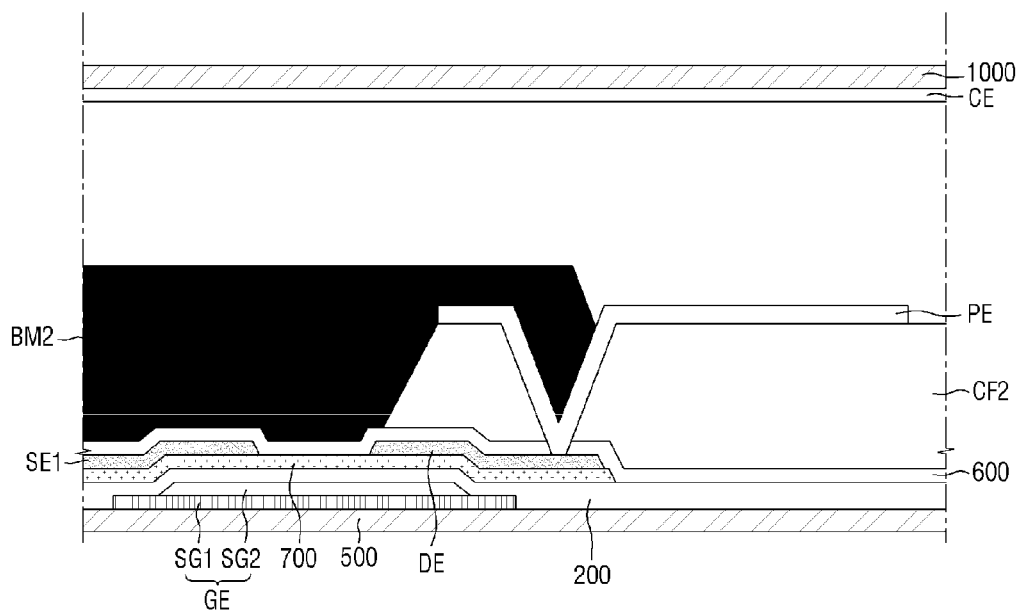
FIG. 9 is a cross-sectional view of a liquid crystal display device according to still another embodiment of the present disclosure.
Figure 10:
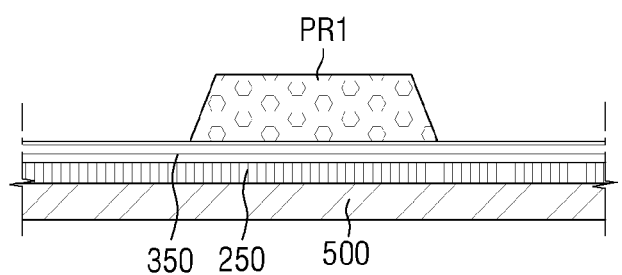
FIGS. 10, 11, 12, 13, 14 and 15 are cross-sectional views illustrating a method of manufacturing a liquid crystal display device according to an embodiment of the present disclosure.

FIG. 9 is a cross-sectional view of a liquid crystal display device according to still another embodiment of the present disclosure.

Referring to FIG. 9, a liquid crystal display device according to still another embodiment of the present disclosure is different from the liquid crystal display device shown in FIG. 9 in that a black matrix BM2 and a color filter CF2 are disposed over the substrate 500.

Since the source electrode SE and the drain electrode DE may be disposed on the first substrate 500 as described with reference to FIG. 3, a detailed description thereof is omitted.

A passivation layer 600 may be disposed on the data wiring (DL, SE, DE, 150) and the semiconductor pattern layer 700. The passivation layer 600 may contain an inorganic insulating material. For example, the passivation layer 600 may be made of silicon oxide, silicon nitride, silicon oxynitride, aluminum oxynitride, titanium oxynitride, zirconium oxynitride, hafnium oxynitride, tantalum oxynitride, or tungsten oxynitride. However, the above materials are illustrative, and the material of the passivation layer is not limited thereto.

A contact hole for exposing a drain electrode expansion part 150 may be formed in the passivation layer 600.

A color filter CF2 may be formed on the passivation layer 600. The color filter CF2 may include one or more selected from a blue color filter, a green color filter, and a red color filter. In an exemplary embodiment, the heights of the blue color filter, the green color filter, and the red color filter may be different from one another.

A contact hole for exposing the drain electrode DE may be disposed in the color filter CF2. The contract hole disposed in the color filter CF2 may overlap the above-mentioned contact hole formed in the passivation layer 600. Thus, the drain electrode DE is exposed, and a pixel electrode PE, which is described later, may be electrically connected with the exposed drain electrode DE.

A pixel electrode PE may be disposed on the color filter CF2. The pixel electrode PE may be electrically connected with the drain electrode DE through the contact hole formed in the passivation layer 600 and the contact hole formed in the color filter CF2.

In an exemplary embodiment, the pixel electrode may be made of a transparent conductor, such as indium tin oxide (ITO) or indium zinc oxide (IZO), or a reflective conductor, such as aluminum.

A black matrix BM2 may be disposed on the passivation layer 600. The black matrix BM2 may be disposed to extend along the data line DL. The width of the black matrix BM2 may be substantially equal to or greater than the width of the data line DL. Further, the black matrix BM2 may cover the source electrode SE, the drain electrode DE, and the channel. In other words, the black matrix BM2 may overlap a thin film transistor, and may cover the area in which the thin film transistor.

The black matrix BM2 serves to block external incident light. For this purpose, the black matrix BM2 may be made of a photosensitive resin containing a black pigment. However, this photosensitive resin is illustrative, and the material of the black matrix BM2 is not limited thereto. Any material may be used as the material of the black matrix BM2 as long as it has physical properties suitable for blocking external incident light.

The second substrate 1000 may be disposed to face the first substrate 500. A common electrode CE, as a front electrode, may be disposed on the second substrate 1000. Since this common electrode CE is substantially identical to that described with reference to FIG. 8, a detailed description thereof is omitted.

FIGS. 8 and 9 illustrate a case in which the common electrode CE is disposed on the second substrate 1000, but the scope of the present disclosure is not limited thereto. That is, in another exemplary embodiment, the common electrode CE may also be disposed on the first substrate 500. That is, in another exemplary embodiment, the liquid crystal display device may be a liquid crystal display device of a PLS or IPS mode.

Hereinafter, a method of manufacturing a liquid crystal display device according to an embodiment of the present disclosure is described. Some of the configurations described below may be the same as those of the above-mentioned liquid crystal display according to some embodiments of the present disclosure. In order to avoid duplicate description, a description of some configurations is omitted.

FIGS. 10 to 15 are cross-sectional views illustrating a method of manufacturing a liquid crystal display device according to an embodiment of the present disclosure.

Referring to FIGS. 10 to 15, a method of manufacturing a liquid crystal display device according to an embodiment of the present disclosure includes the steps of: providing a first substrate including a first conductive film 250 and a second conductive film 350 disposed on the first conductive film 250; forming a first photoresist pattern PR1 on the second conductive film 350; and forming a gate electrode GE including a first sub gate electrode SG1 and a second sub gate electrode SG2 using the first photoresist pattern PR1 as an etching mask.

First, a first conductive film 250 is formed on a first substrate 500. The first conductive film 250 may be made of a material substantially identical to the metal material constituting the above-mentioned gate electrode GE. The first conductive film 250 may be formed by chemical vapor deposition or sputtering.

A second conductive film 350 may be formed on the first conductive film 250. The second conductive film 350 may be made of a material substantially identical to the metal material constituting the above-mentioned gate electrode GE. The second conductive film 350 may be formed by chemical vapor deposition or sputtering. However, the first conductive film 250 and the second conductive film 350 may be made of materials different from each other. That is, the first conductive film 250 and the second conductive film 350 may be made of materials having etch rates different from each other with respect to the same etchant. This is related to a method of forming protrusions using the difference in etch rate therebetween, which is described later.

Subsequently, a first photoresist pattern PR1 is formed on the second conductive 350. The first photoresist pattern PR1 may be obtained by applying a photoresist film and then exposing and developing the applied photoresist film.

Figure 11:
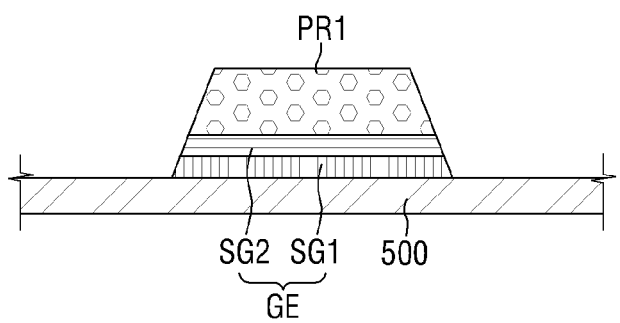

Subsequently, referring to FIG. 11, the first conductive film 250 and the second conductive film 350 are etched by using the first photoresist pattern PR1 as an etching mask to form a gate electrode GE. As described above, the gate electrode GE may include a first sub gate electrode SG1 and a second sub gate electrode SG2.

The step of forming the gate electrode GE by etching the first conductive film 250 and the second conductive film 350 may include the step of forming the first sub gate electrode SG1 and the second sub gate electrode SG2 by etching the first conductive film 250 and the second conductive film 350. That is, the first conductive film 250 and the second conductive film 350 may be isotropically etched through a wet etching process.

Figure 12:
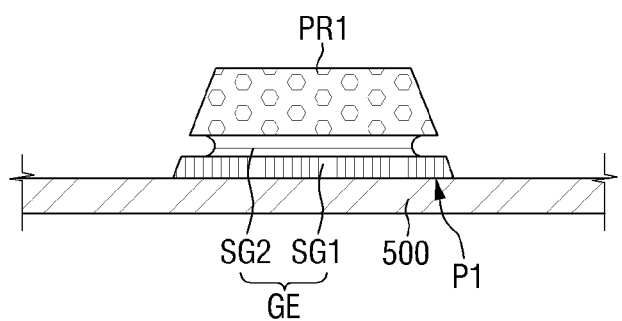

Subsequently, referring to FIG. 12, the formed first sub gate electrode SG1 and second sub gate electrode SG2 are over-etched to form a protrusion P1. As described above, the etch rates of the first sub gate electrode SG1 and second sub gate electrode SG2 with respect to the specific etchant may be different from each other. Specifically, with respect to the etchant used in the method of manufacturing a liquid crystal display device according to an embodiment of the present disclosure, the etch rate of the first sub gate electrode SG1 may be lower than the etch rate of the second sub gate electrode SG2. In this case, when the first sub gate electrode SG1 and second sub gate electrode SG2 are exposed to the etchant as shown in FIG. 12, a skew phenomenon occurs at both sides of the second sub gate electrode SG2 formed beneath the first photoresist pattern PR1, and thus the end of the first sub-gate electrode SG1 may protrude compared to the end of the second sub-gate electrode SG2. That is, the protrusion P1 of the gate electrode GE may be formed as the first sub gate electrode SG1.

Since the first sub gate electrode SG1 and the second sub gate electrode SG2 may be substantially identical to those described with reference to FIG. 3, a detailed description thereof is omitted.

Figure 13:
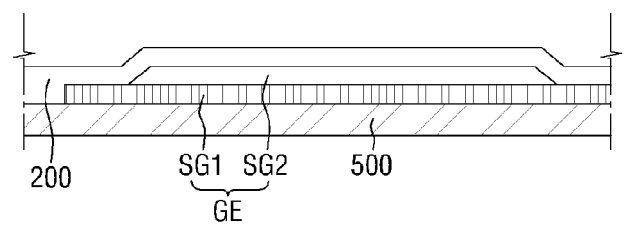

Subsequently, referring to FIG. 13, a gate insulating film 200 may be disposed on the gate electrode GE. The gate insulating film 200 may be formed by chemical vapor deposition or the like.

Figure 14:
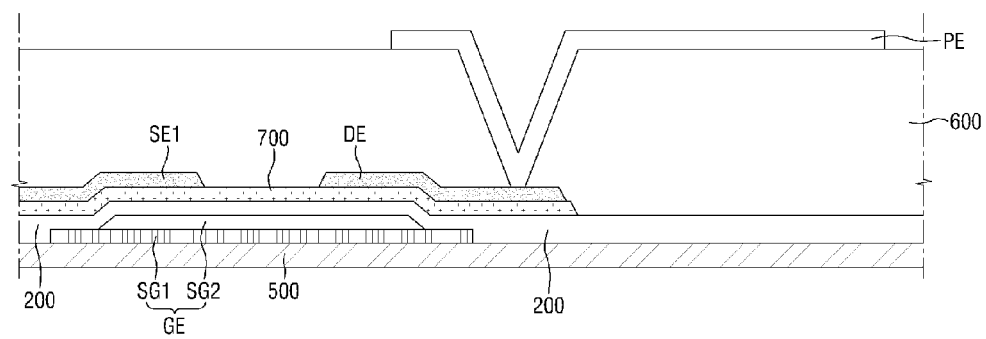

Subsequently, referring to FIG. 14, a semiconductor pattern layer 700, a source electrode SE, and a drain electrode DE may be disposed on the gate insulating film 200.

Subsequently, a passivation layer 600 may be disposed on the source electrode SE, the drain electrode DE, and the semiconductor pattern layer 700.

Subsequently, a pixel electrode PE may be disposed on the passivation layer 600. The source electrode SE, the drain electrode DE, and the semiconductor pattern layer 700 may be substantially identical to those described in the liquid crystal display devices according to some embodiments of the present disclosure. Therefore, a detailed description thereof is omitted.

Figure 15:
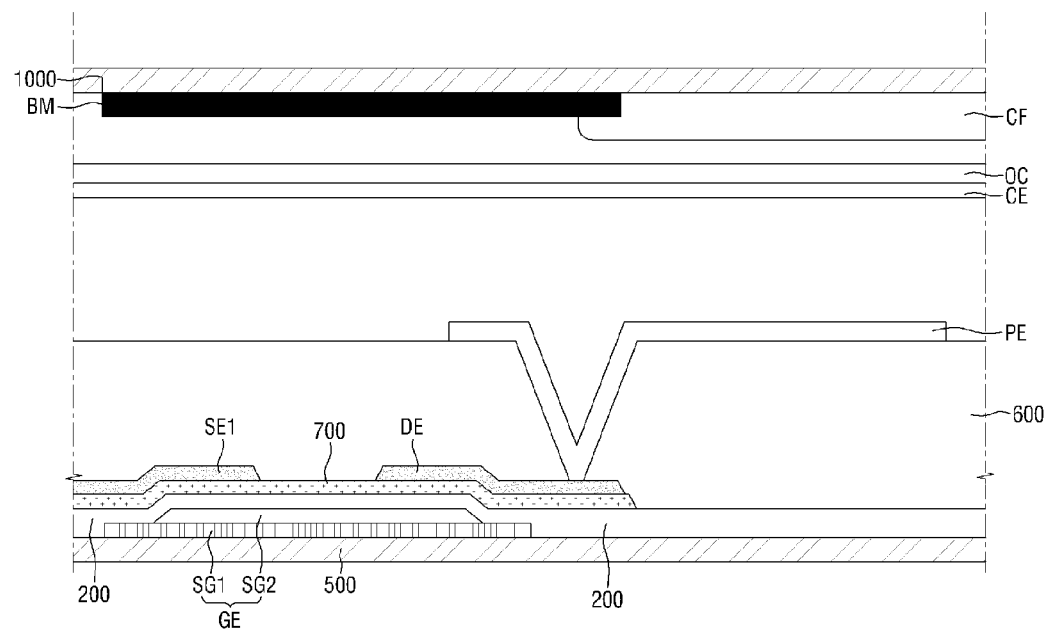

Subsequently, referring to FIG. 15, a second substrate 1000 provided with a black matrix BM, a color filer CF, an overcoat OC, and a common electrode CE is attached to the first substrate 500 such that second substrate 1000 and the first substrate 500 face each other. The black matrix BM, the color filer CF, the overcoat OC, and the common electrode CE may be substantially identical to those described in the liquid crystal display devices according to some embodiments of the present disclosure. Therefore, a detailed description thereof is omitted.

As described above, according to embodiments of the present disclosure, the following effects may be achieved.

In the liquid crystal display, it is possible to prevent the characteristics of a semiconductor pattern from being deteriorated by the light provided from a backlight unit.

In the crystal display, it is possible to prevent the leakage of a semiconductor pattern from occurring by the light provided from the backlight unit.

The effects of the present disclosure are not limited by the foregoing, and other various effects are anticipated herein.

Although the preferred embodiments of the present disclosure have been disclosed for illustrative purposes, those skilled in the art would appreciate that various modifications, additions and substitutions are possible, without departing from the scope and spirit of the accompanying claims. That is, the exemplary embodiments should be considered in a descriptive sense only and not for purposes of limitation.

What is claimed is:

1. A liquid crystal display device, comprising:
a first substrate;
a gate electrode disposed on the first substrate;
a semiconductor pattern layer disposed on the gate electrode; and
a source electrode and a drain electrode disposed on the semiconductor pattern layer and facing each other,
wherein the gate electrode includes a reference plane and a protrusion protruding from the reference plane in a horizontal direction, and the protrusion overlaps the source electrode and the drain electrode, and
wherein the protrusion includes a plurality of protrusions disposed to correspond to the source electrode and the drain electrode.

2. The liquid crystal display device of claim 1,
wherein the gate electrode includes a first sub gate electrode and a second sub gate electrode disposed on the first sub gate electrode,
the first sub gate electrode includes an overlapping area in which the first sub gate electrode overlaps the second sub gate electrode, and non-overlapping areas in which the first sub gate electrode does not overlap the second sub gate electrode, and
the protrusion includes the non-overlapping areas.

3. The liquid crystal display device of claim 2,
wherein the first sub gate electrode and the second sub gate electrode are made of materials different from each other.

4. The liquid crystal display device of claim 1, wherein the gate electrode comprises:
a first sub gate electrode;
a second sub gate electrode disposed on the first sub gate electrode; and
a third sub gate electrode disposed on the second sub gate electrode,
wherein the first sub gate electrode and the second sub gate electrode include an overlapping area in which the first sub gate electrode and the second sub gate electrode overlap the third sub gate electrode, and non-overlapping areas in which the first sub gate electrode and the second sub gate electrode do not overlap the third sub gate electrode, and the protrusion includes the non-overlapping areas of the first sub gate electrode and the second sub gate electrode.

5. The liquid crystal display device of claim 4,
wherein the third sub gate electrode and the second sub gate electrode are made of materials different from each other.

6. The liquid crystal display device of claim 5,
wherein the third sub gate electrode and the first sub gate electrode are made of materials the same as each other.

7. The liquid crystal display device of claim 1,
wherein the width of the protrusion is equal to the width of the source electrode or the drain electrode overlapping the protrusion.

8. The liquid crystal display device of claim 1,
wherein the source electrode includes a bar-shaped portion and a U-shaped portion, and the protrusion overlaps the bar-shaped portion of the source electrode.

9. The liquid crystal display device of claim 1,
wherein the source electrode includes first to third source electrodes,
the drain electrode includes first to third drain electrodes corresponding to the first to third source electrodes, and
the protrusion includes first to fifth protrusions,
wherein the first to fifth protrusions respectively overlap the first to third source electrodes and the first to third drain electrodes.

10. The liquid crystal display device of claim 1, further comprising:
a second substrate facing the first substrate; and
a common electrode disposed on the second substrate.

11. A method of manufacturing a liquid crystal display device, comprising:
providing a first substrate including a first conductive film and a second conductive film disposed on the first conductive film;
forming a first photoresist pattern on the second conductive film; and
forming a gate electrode including a first sub gate electrode and a second sub gate electrode by etching the first conductive film and the second conductive film using the first photoresist pattern as an etching mask,
wherein the gate electrode includes a reference plane and a protrusion protruding from the reference plane in a horizontal direction.

12. The method of claim 11,
wherein the first conductive film and the second conductive film are made of materials having etch rates different from each other with respect to a predetermined etchant.

13. The method of claim 12,
wherein the forming the gate electrode including the first sub gate electrode and the second sub gate electrode by etching the first conductive film and the second conductive film using the first photoresist pattern as an etching mask includes: wet-etching the first conductive film and the second conductive film.

14. The method of claim 11,
wherein the forming the gate electrode including the first sub gate electrode and the second sub gate electrode by etching the first conductive film and the second conductive film using the first photoresist pattern as an etching mask includes: over-etching the second sub gate electrode to form the protrusion as a part of the first sub gate electrode after forming the first sub gate electrode and the second sub gate electrode by etching the first conductive film and the second conductive film.

* * * * *